United States Patent [19]
Conte et al.

[11] Patent Number: 5,420,551
[45] Date of Patent: May 30, 1995

[54] CIRCUIT FOR BROADBAND VIDEO TRANSMISSION OVER UNSHIELDED TWISTED WIRE PAIRS

[75] Inventors: Robert A. Conte, Manalapan Township, Monmouth County; William H. Georger, Dover Township, Ocean County, both of N.J.

[73] Assignee: AT&T Corp., Murray Hill, N.J.

[21] Appl. No.: 267,343

[22] Filed: Jun. 29, 1994

[51] Int. Cl.6 .............................................. H03H 7/42
[52] U.S. Cl. ......................................... 333/12; 333/25
[58] Field of Search ................... 333/4, 5, 119, 124, 333/131, 12, 24 R, 25, 177; 379/416; 348/6

[56] References Cited

U.S. PATENT DOCUMENTS

| | | |
|---|---|---|
| 3,731,237 | 5/1973 | Beurrier . |
| 4,766,402 | 8/1988 | Crane ................................ 333/25 |
| 4,885,747 | 12/1989 | Foglia . |
| 5,010,399 | 4/1991 | Goodman et al. . |
| 5,077,543 | 12/1991 | Carlile ............................... 333/25 X |
| 5,283,789 | 2/1994 | Gunnarsson et al. . |
| 5,363,068 | 11/1994 | Georger .............................. 333/25 |

OTHER PUBLICATIONS

*Systimax ®Premises Distribution System Components Guide*, AT&T Doc. No. 3726C (Dec. 1990), pp. 3–10.

*Primary Examiner*—Paul Gensler
*Attorney, Agent, or Firm*—Lester H. Birnbaum

[57] ABSTRACT

Disclosed is a circuit which permits transmission of broadband analog CATV video signals on unshielded twisted wire pairs. The circuit includes an autotransformer with a ground connection coupled to the node between two secondary windings. The two opposite ends of the secondary windings are coupled to a choke, which, in turn, is coupled to an isolation transformer with a center-tapped primary and secondary winding for shunting any remaining common-mode currents.

4 Claims, 1 Drawing Sheet

CIRCUIT FOR BROADBAND VIDEO TRANSMISSION OVER UNSHIELDED TWISTED WIRE PAIRS

BACKGROUND OF THE INVENTION

This invention relates to broadband analog video transmission.

Rather than transmit broadband video signals over standard coaxial cables, it is usually more economical to transmit over unshielded twisted wire pairs which are used for analog voice transmission in telecommunications systems. Such a transmission system would allow broadband signals to be brought to the desk using wiring which is already available in the physical structure. (See, e.g., *Systimax ® Premises Distribution System Components Guide*, AT&T Doc. No. 3726C (Dec. 1990), p. 3-10.)

U.S. Pat. No. 3,731,237 issued to Beurrier suggests use of an autotransformer with electrically coupled multiple windings for broadband transmission. Electrical coupling between the windings can be via twisted pairs. However, it does not appear that transmission of the video signals is intended to take place over unshielded twisted wire pairs.

U.S. Pat. No. 4,885,747 issued to Foglia utilizes a transformer with three windings to transmit both broadband and baseband video signals over shielded twisted wire pairs. Again, no transmission over unshielded twisted wire pairs is contemplated.

U.S. Pat. No. 5,010,399 issued to Goodman et al. shows an isolation transformer with three windings as part of a coupling network which modulates a baseband or broadband video signal so it can share the same unshielded twisted wire pair as voice signals.

U.S. Pat. No. 5,283,789 issued to Gunnarsson et al. utilizes an isolation transformer and an inductive network to couple both baseband digital data and broadband video signals onto a single unshielded twisted wire pair.

A significant problem in attempting to transmit broadband signals on unshielded twisted pair cables is the development of noise in the form of common-mode currents which can travel down the wire pairs causing radiated emissions exceeding electromagnetic interference (EMI) standards. It is desirable, therefore, to provide a circuit which will inexpensively limit the appearance of common-mode currents in broadband video transmission.

SUMMARY OF THE INVENTION

The invention is a circuit for transmitting and receiving broadband video signals. The circuit includes an autotransformer having first, second, and third windings electrically coupled in series. Adjacent ends of the second and third windings are coupled to ground. The opposite end of the second winding is coupled to the first winding and to one end of a fourth winding of a longitudinal choke transformer. The opposite end of the third winding of the first transformer is coupled to one end of a fifth winding of the longitudinal choke transformer. The opposite ends of the windings of the longitudinal choke transformer are coupled to respective opposite ends of a primary winding of a third transformer. Opposite ends of a secondary winding of the third transformer are adapted for coupling to a twisted wire pair. Center taps of the primary and secondary windings of the third transformer are electrically coupled to ground potential.

BRIEF DESCRIPTION OF THE DRAWING

These and other features of the invention are delineated in detail in the following description. In the drawing.

DETAILED DESCRIPTION

Figure 1:
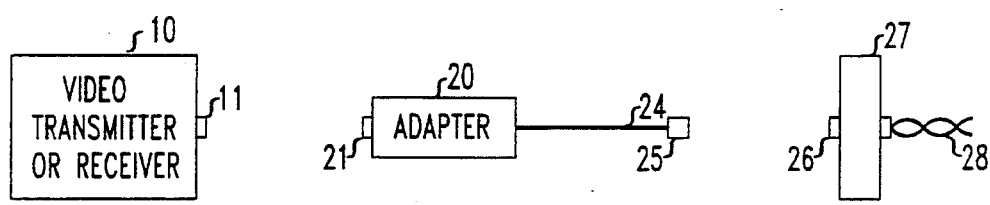
FIG. 1 is a block diagram of a system including the invention in accordance with one embodiment.

FIG. 1 illustrates the use of the inventive circuit to permit transmission and reception of a broadband video signal over a twisted wire pair which is included with other twisted wire pairs in a single cable sheath. A video transmitter or receiver 10 generates or receives a broadband video signal at the input/output port 11. The invention is most advantageous for transmission in the 50-300 MHz range. The input/output port 11 is electrically coupled to an adapter 20. The adapter includes a port 21 which is a standard F-type plug for electrically engaging the input/output port 11. At the other end of the adapter 20 is a cord 24 comprising an unshielded twisted wire pair. The opposite end of the cord 24 terminates in a standard modular plug 25. The plug 25 mates with a modular jack 26 which is a part of an information outlet 27 mounted to the wall of a building. This information outlet couples the video signals onto a twisted wire pair of a four-pair cable 28 which runs through the building. The information outlet 27 is a standard part of an AT&T Systimax ® Premises Distribution System. (See, for example, *Systimax ® Premises Distribution System Components Guide*, AT&T Doc. No. 3726C (Dec. 1990), p. 3-10.)

Figure 2:
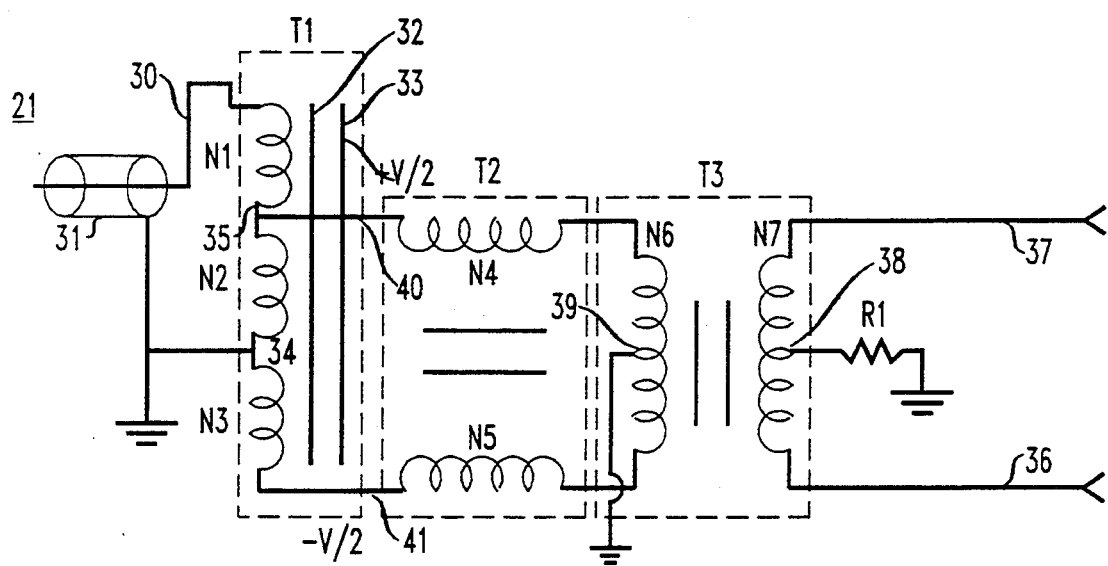
FIG. 2 is a schematic circuit diagram of one embodiment of the invention.

FIG. 2 illustrates the adapter 20 in accordance with one embodiment of the invention. The port 21, as shown, comprises a standard receptacle including a signal conductor 30 and a shield 31 which is grounded. The signal conductor 30 is coupled to one end of a first winding $N_1$ of an autotransformer $T_1$. The opposite end of the first winding is coupled in series to one end of a second winding $N_2$. The opposite end of the second winding is coupled to one end of a third winding $N_3$. The windings $N_1$, $N_2$, and $N_3$ are typically wound around the same core, illustrated by lines 32 and 33, in a tri-filar arrangement. The electrically coupled ends of windings $N_2$ and $N_3$ (i.e., node 34) are coupled to ground.

The electrically coupled ends of winding $N_1$ and winding $N_2$ (i.e., node 35) are coupled to one end of winding $N_4$ of a longitudinal choke transformer $T_2$. The end of winding $N_3$ of the autotransformer $T_1$ which is opposite to node 34 is coupled to one end of winding $N_5$ of longitudinal choke transformer $T_2$.

The opposite end of winding $N_4$ is coupled to one end of a primary winding $N_6$ of an isolation transformer $T_3$. The opposite end of winding $N_5$ is coupled to the end of primary winding $N_6$ which is opposite to the connection to winding $N_4$. A center tap 39 is provided to the center of primary winding $N_6$ and is electrically connected to ground potential.

One end of the secondary winding $N_7$ of the third transformer is coupled to one wire, 37, of a twisted pair, which typically comprises a modular cord. The opposite end of the secondary winding $N_7$ is coupled to the other wire, 36, of a twisted pair of the cord.

A center tap 38 is provided to the center of secondary winding $N_7$ of transformer $T_3$. The tap is electrically coupled to ground potential through a resistor $R_1$.

In operation, a video signal appears at port 21 and is applied to transformer $T_1$. The resulting voltage $(+V/2, -V/2)$ on conductors 40 and 41 is balanced since the connected ends of $N_2$ and $N_3$ are coupled to ground potential (node 34). The numbers of windings in $N_1$ and $N_2$ are chosen to match the impedance of the connector 21, which is typically 75 ohms. The number of windings of $N_3$ in combination with the number of windings of $N_2$ is chosen to provide an impedance which will match the twisted wire pairs. This value is typically 100 ohms. In a typical example, therefore, $N_1$ has 27 turns and $N_2$ and $N_3$ each have 37 turns.

It is also desirable to have a high permeability material for the core so that more inductance per turn can be achieved. In general, the permeability should be at least 10,000. This will both improve the high frequency response by minimizing interwinding capacitance, and reduce the overall physical size of the autotransformer $T_1$.

The balanced signal appearing on conductors 40 and 41 is coupled to $T_2$ which operates as a longitudinal choke. Longitudinal choke $T_2$ exhibits a high impedance to any common-mode currents from autotransformer $T_1$, but exhibits a low impedance to the differential mode video signal $(+V/2, -V/2)$, as explained below.

The resulting signal is coupled to the primary winding $N_6$ of isolation transformer $T_3$, which serves to shunt any common-mode currents passing through longitudinal choke $T_2$ via center tap 39 to ground potential while allowing the differential mode video signal to be induced into the winding $N_7$. The differential mode video signal, therefore, appears on the conductors 36 and 37 of modular cord 24 for further transmission.

Center tap 38 of the winding $N_7$ serves to shunt common-mode currents appearing on the four-pair cable 28 to ground potential through resistor $R_1$. The differential mode currents will not be affected since they cancel at the center tap 38 and so the tap appears as a high impedance to the differential mode video signal.

In order to provide adequate shunting, $R_1$ should be chosen so as to be impedance matched to the source of the common-mode currents. This requires measuring the common-mode impedance for a number of four-pair cables and then choosing $R_1$ accordingly. It is expected that for most systems, the resistance of $R_1$ will be within the range of 50-120 ohms.

It will be appreciated, therefore, that the invention makes use of the fact that differential mode currents will travel in different directions in all windings of the transformers ($T_2$ and $T_3$), while common-mode signals will travel in the same directions in each winding. Differential mode currents produce a mutual inductance between the windings which is subtracted from the sellinductance of those windings. This results in a low impedance to the differential mode signals (i.e., less than 10 ohms). On the other hand, since the common-mode signals travel in the same direction in the windings, the mutual inductance produced thereby is additive to the self-inductance of the windings to provide the high impedance to the common-mode signals (i.e., greater than 1 k ohms).

Various additional modifications will become apparent to those skilled in the art. All such variations which basically rely on the teachings through which the invention has advanced the art are properly considered within the scope of the invention.

We claim:

1. A circuit for transmitting and receiving broadband analog video signals comprising:
    an autotransformer having first, second and third windings electrically coupled in series, the adjacent ends of the second and third windings being coupled to ground potential, the opposite end of the second winding being coupled to the first winding;
    a longitudinal choke transformer having fourth and fifth windings, one end of the fourth winding being coupled to the opposite end of the second winding and to the first winding of the autotransformer, and one end of the fifth winding being coupled to the opposite end of the third winding of the first autotransformer; and
    an isolation transformer having primary and secondary windings, opposite ends of the primary winding of the third transformer being coupled to respective opposite ends of the windings of the longitudinal choke, a center portion of each of the primary and secondary windings of the isolation transformer being coupled to ground potential.

2. The circuit according to claim 1 wherein the secondary winding of the isolation transformer is coupled to conductors for transmitting the differential mode video signals to the twisted wire pairs, and further comprising a resistor coupled between the center portion of the secondary winding and ground potential.

3. The circuit according to claim 2 wherein the resistor has a resistance within the range of 50-120 ohms.

4. The circuit according to claim 1 wherein the means for transmitting differential mode video signals to a twisted wire pair comprises a modular cord.

* * * * *